United States Patent
Park et al.

(10) Patent No.: US 8,252,686 B2
(45) Date of Patent: Aug. 28, 2012

(54) METHOD FOR FORMING COPPER WIRING IN A SEMICONDUCTOR DEVICE

(75) Inventors: Hyung Soon Park, Gyeonggi-do (KR); Noh Jung Kwak, Gyeonggi-do (KR); Seung Jin Yeom, Gyeonggi-do (KR); Choon Kun Ryu, Seoul (KR); Jong Goo Jung, Gyeonggi-do (KR); Sung Jun Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 309 days.

(21) Appl. No.: 12/427,870

(22) Filed: Apr. 22, 2009

(65) Prior Publication Data

US 2010/0210104 A1    Aug. 19, 2010

(30) Foreign Application Priority Data

Feb. 16, 2009  (KR) .................. 10-2009-0012418

(51) Int. Cl.
*H01L 21/302* (2006.01)

(52) U.S. Cl. ...................... 438/692; 438/690

(58) Field of Classification Search .............. 438/689, 438/690, 692
See application file for complete search history.

(56) References Cited

U.S. PATENT DOCUMENTS

| | | | |
|---|---|---|---|
| 6,265,781 B1 | 7/2001 | Andreas | |
| 6,443,814 B1 | 9/2002 | Miller et al. | |
| 6,492,308 B1 * | 12/2002 | Naghshineh et al. | 510/175 |
| 2003/0160332 A1 * | 8/2003 | Jiang et al. | 257/774 |
| 2003/0190816 A1 * | 10/2003 | Buehler et al. | 438/758 |
| 2005/0199264 A1 * | 9/2005 | Andreas | 134/2 |
| 2006/0194349 A1 * | 8/2006 | Preusse et al. | 438/5 |

FOREIGN PATENT DOCUMENTS

| | | |
|---|---|---|
| KR | 10-0831180 B1 | 3/2003 |
| KR | 1020030025238 A | 3/2003 |
| KR | 1020040000705 A | 1/2004 |
| KR | 1020060050430 A | 5/2006 |

\* cited by examiner

*Primary Examiner* — Bradley K Smith
(74) *Attorney, Agent, or Firm* — Ladas & Parry LLP

(57) ABSTRACT

A process for forming a copper wiring and the prevention of copper ion migration in a semiconductor device is disclosed herein. The process includes conducting a post-cleaning process for a copper layer that is to form the cooper wiring after already having undergone a CMP process. The post-cleaning process includes conducting a primary chemical cleaning using a citric acid-based chemical. A secondary chemical cleaning is then conducted on the copper layer having undergone the primary chemical cleaning using an ascorbic acid-based chemical. After the post-cleaning process is completed, the migration of copper ions over time is prevented thereby improving the reliability of the semiconductor device.

48 Claims, 5 Drawing Sheets

METHOD FOR FORMING COPPER WIRING IN A SEMICONDUCTOR DEVICE

CROSS-REFERENCE TO RELATED APPLICATIONS

The present application claims priority to Korean patent application number 10-2009-0012418 filed on Feb. 16, 2009, which is incorporated herein by reference in its entirety.

BACKGROUND OF THE INVENTION

The present invention relates to a method for forming a copper wiring in a semiconductor device, and more particularly, to a method for forming a copper wiring in a semiconductor device that can prevent copper (Cu) ions from migrating over time after conducting a CMP (chemical mechanical polishing) process for a copper layer.

As the design rule of a semiconductor device decreases, circuits are being designed using a multi-layered wiring structure. In this regard, as the design rule of a semiconductor device decreases below 130 nm and the feature size of a transistor is reduced, the operation of the semiconductor device should improve in conformity with the decrease in the design rule. However, as the gap between metal wirings of the semiconductor device decreases, the parasitic capacitance induced between the metal wirings increases. As a result, the operation of the semiconductor device tends to deteriorate.

In order to cope with this problem, copper (Cu) has recently been used as the material for the metal wirings of the semiconductor device in place of aluminum (Al). Since copper has excellent electrical conductivity and a low resistance when compared to aluminum and tungsten, it is possible to solve the problems associated with RC signal delay in a semiconductor device having a high level of integration and a high operation speed.

However, it is not easy to etch copper. Therefore in order to form a copper wiring, a damascene process is employed. The damascene process is divided into a single damascene process and a dual damascene process. In the case of a dual damascene process, it is possible to simultaneously form a copper wiring and a contact plug for rendering electrical connection with an underlying layer. As a result, a dual damascene process is advantageous in terms of processing as compared to a single damascene process.

In a metal wiring formed of copper, EM (electromigration) characteristics, SM (stress migration) characteristics, and TDDB (time dependent dielectric breakdown) characteristics are important aspects. In particular, in the case of the TDDB characteristics, when using existing metals such as aluminum and tungsten as the material of wirings, serious problems are avoided. However, when copper is used, the TDDB characteristics are important since the diffusion of copper ions actively occurs. For example, after a CMP process is conducted for a copper layer, the migration of copper ions over time is an important factor that causes a bridge phenomenon between adjoining copper wirings, the deterioration of leakage current characteristics, and the occurrence of a TDDB failure.

SUMMARY OF THE INVENTION

Embodiments of the present invention are directed to a method for forming a copper wiring in a semiconductor device that can prevent copper ions from migrating with the lapse of time after conducting a CMP process for a copper layer.

Embodiments of the present invention are also directed to a method for forming a copper wiring in a semiconductor device which can suppress the migration of copper ions, thereby preventing a bridge phenomenon from occurring between adjoining copper wirings, leakage current characteristics from deteriorating, and a TDDB fail from resulting.

Further, embodiments of the present invention are directed to a method for forming a copper wiring in a semiconductor device that can improve the reliability of a semiconductor device.

In one embodiment of the present invention, a method for forming a copper wiring in a semiconductor device includes the step of conducting a post-cleaning process for a copper layer having undergone a CMP process, the post-cleaning process comprising the steps of conducting primary chemical cleaning by using a citric acid-based chemical; and conducting secondary chemical cleaning for the copper layer having undergone the primary chemical cleaning by using an ascorbic acid-based chemical.

Before the step of conducting the primary chemical cleaning, the post-cleaning process further comprises the step of conducting megasonic cleaning.

The megasonic cleaning is conducted by using deionized water and setting megasonic power to 5~1,000 W.

The citric acid-based chemical has a pH value of 6.7~12.7 and an electrochemical potential of −0.4~0.4V.

The secondary chemical cleaning is conducted by adding deionized water, ethanolamine and TMAH to the ascorbic acid-based chemical.

The ascorbic acid-based chemical is mixed in an amount of 1~10 wt % of an entire chemical, the deionized water is mixed in an amount of 70~90 wt % of the entire chemical, the ethanolamine is mixed in an amount of 1~10 wt % of the entire chemical, and the TMAH is mixed in an amount of 1~15 wt % of the entire chemical.

After the step of conducting the secondary chemical cleaning, the post-cleaning process further comprises the step of conducting IPA drying.

In another embodiment of the present invention, a method for forming a copper wiring in a semiconductor device comprises the steps of forming an interlayer dielectric having a wiring forming area, on a semiconductor substrate; depositing a copper layer to fill the wiring forming area; removing the copper layer through a CMP process until the interlayer dielectric is exposed; and conducting a post-cleaning process including primary chemical cleaning by using a citric acid-based chemical and secondary chemical cleaning by using an ascorbic acid-based chemical, for the copper layer having undergone the CMP process.

After the step of forming the interlayer dielectric and before the step of depositing the copper layer, the method further comprises the step of forming a barrier layer on the interlayer dielectric including a surface of the wiring forming area.

The barrier layer comprises at least one selected from Ti, TiN, Ta, TaN and Ru layers and has a thickness of 100~500 Å.

The post-cleaning process further includes megasonic cleaning before the primary chemical cleaning.

The megasonic cleaning is conducted by using deionized water and setting megasonic power to 5~1,000 W.

The citric acid-based chemical has a pH value of 6.7~12.7 and an electrochemical potential of −0.4~0.4V.

The secondary chemical cleaning is conducted by adding deionized water, ethanolamine and TMAH to the ascorbic acid-based chemical.

The ascorbic acid-based chemical is mixed in an amount of 1~10 wt % of an entire chemical, the deionized water is mixed in an amount of 70~90 wt % of the entire chemical, the ethanolamine is mixed in an amount of 1~10 wt % of the entire chemical, and the TMAH is mixed in an amount of 1~15 wt % of the entire chemical.

The post-cleaning process further includes IPA drying after the second chemical cleaning.

After the step of conducting the post-cleaning process, the method further comprises the step of plasma-processing a surface of the copper layer.

The plasma-processing is conducted by using any one of $H_2$, $N_2$ and $NH_3$.

After the plasma-processing step, the method further comprises the step of forming a diffusion barrier on the copper layer.

The diffusion barrier comprises any one of an $Si_3N_4$ layer, an SiOC layer, an SiC layer, and an SiCN layer.

In still another embodiment of the present invention, a method for forming a copper wiring in a semiconductor device includes the steps of conducting a CMP process for a copper layer which is deposited to fill a wiring forming area defined in an interlayer dielectric, to expose the interlayer dielectric, and conducting a post-cleaning process for the copper layer having undergone the CMP process and the interlayer dielectric, wherein the post-cleaning process includes chemical cleaning by using quaternary alkyl ammonium salt.

The post-cleaning process further includes megasonic cleaning before the chemical cleaning by using the quaternary alkyl ammonium salt.

The megasonic cleaning is conducted by using deionized water and setting megasonic power to 5~1,000 W.

Before the chemical cleaning by using the quaternary alkyl ammonium salt, the post-cleaning process further includes megasonic cleaning, and chemical cleaning by using a citric acid-based chemical.

The megasonic cleaning is conducted by using deionized water and setting megasonic power to 5~1,000 W.

The citric acid-based chemical has a pH value of 6.7~12.7 and an electrochemical potential of −0.4~0.4V.

The quaternary alkyl ammonium salt comprises a polyquaternium-based chemical.

The polyquaternium-based chemical comprises any one of a dodecylethyldimethylammonium bromide, an oleyltriethylammonium bromide, a didecyldimethylammonium phosphate, and a cetyltrimethylammonium chloride.

In a still further embodiment of the present invention, a method for forming a copper wiring in a semiconductor device comprises the steps of forming an interlayer dielectric having a wiring forming area, on a semiconductor substrate; depositing a copper layer to fill the wiring forming area; removing the copper layer through a CMP process until the interlayer dielectric is exposed; and conducting a post-cleaning process including chemical cleaning by using quaternary alkyl ammonium salt, for the copper layer having undergone the CMP process and the interlayer dielectric.

After the step of forming the interlayer dielectric and before the step of depositing the copper layer, the method further comprises the step of forming a barrier layer on the interlayer dielectric including a surface of the wiring forming area.

The barrier layer comprises at least one selected from Ti, TiN, Ta, TaN and Ru layers and has a thickness of 100~500 Å.

The post-cleaning process further includes megasonic cleaning before the chemical cleaning by using the quaternary alkyl ammonium salt.

The megasonic cleaning is conducted by using deionized water and setting megasonic power to 5~1,000 W.

Before the chemical cleaning by using the quaternary alkyl ammonium salt, the post-cleaning process further includes chemical cleaning by using a citric acid-based chemical.

The citric acid-based chemical has a pH value of 6.7~12.7 and an electrochemical potential of −0.4~0.4V.

The quaternary alkyl ammonium salt comprises a polyquaternium-based chemical.

The polyquaternium-based chemical comprises any one of a dodecylethyldimethylammonium bromide, an oleyltriethylammonium bromide, a didecyldimethylammonium phosphate, and a cetyltrimethylammonium chloride.

The post-cleaning process further includes IPA drying after the chemical cleaning by using the quaternary alkyl ammonium salt.

After the step of conducting the post-cleaning process, the method further comprises the step of plasma-processing a surface of the copper layer.

The plasma-processing is conducted by using any one of $H_2$, $N_2$ and $NH_3$.

After the plasma-processing step, the method further comprises the step of forming a diffusion barrier on the copper layer.

The diffusion barrier comprises any one of an $Si_3N_4$ layer, an SiOC layer, an SiC layer, and an SiCN layer.

DESCRIPTION OF SPECIFIC EMBODIMENTS

In the present invention, a post-cleaning process, which is conducted after CMPing (chemically and mechanically polishing) a copper layer, is performed such that (1) a primary chemical cleaning process using a citric acid-based chemical having a specified pH value and a specified electrochemical potential and a secondary chemical cleaning process using an ascorbic acid-based chemical are sequentially conducted, (2) a cleaning process using quaternary alkyl ammonium salt is conducted, or (3) a primary chemical cleaning process using the citric acid-based chemical and a secondary chemical cleaning process using the quaternary alkyl ammonium salt are sequentially conducted.

In using these processes according to the present invention, the migration of copper ions over time can be prevented by preventing further oxidation of the copper layer or suppressing an oxide layer constituting an interlayer dielectric from reacting with copper ions on the surface thereof. As a result, in the present invention, it is possible to prevent a bridge phenomenon from occurring between adjoining copper wirings, leakage current characteristics from deteriorating, and a TDDB failure from resulting, which are due to the migration of the copper ions, whereby the reliability of a semiconductor device can be vastly improved.

Hereafter, specific embodiments of the present invention will be described in detail with reference to the accompanying drawings.

FIGS. 1A through 1E are sectional views showing the processes for a method of forming a copper wiring in a semiconductor device according to the present invention.

Figure 1A:
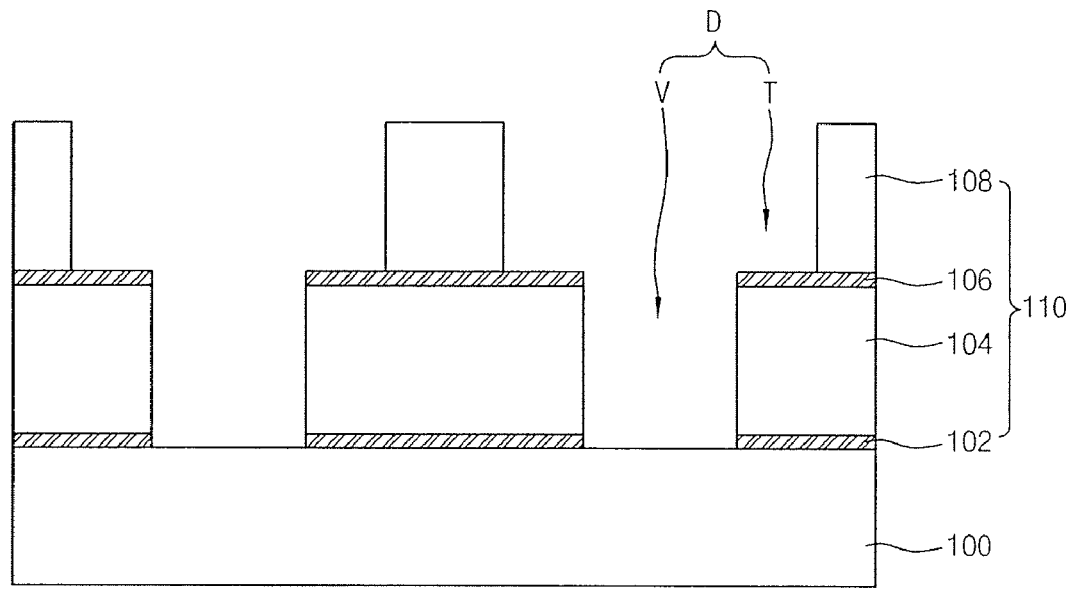
FIGS. 1A through 1E are sectional views showing the processes for a method of forming a copper wiring in a semiconductor device according to an embodiment of the present invention.

Referring to FIG. 1A, a semiconductor substrate 100 is formed with a predetermined underlying structure including transistors and lower metal wirings. An interlayer dielectric 110 is then formed on the semiconductor substrate 100. The interlayer dielectric 110 is formed, for example, as a stacked structure including a first etch stop layer 102, a first insulation layer 104, a second etch stop layer 106, and a second insulation layer 108. The first and second etch stop layers 102 and 106 comprise nitride layers, and the first and second insulation layers 104 and 108 comprise USG (undoped silicate glass)-based oxide layers, F (fluorine)-doped oxide layers, or low dielectric insulation layers having a low dielectric constant below 3.2.

A wiring forming area D is defined by etching the interlayer dielectric 110 in which a copper wiring is to be formed. The wiring forming area D is defined using a single or dual damascene process. Preferably, the wiring forming area D is defined through a dual damascene process to have a structure that includes a via-hole V and a trench T as shown in FIG. 1A.

Figure 1B:
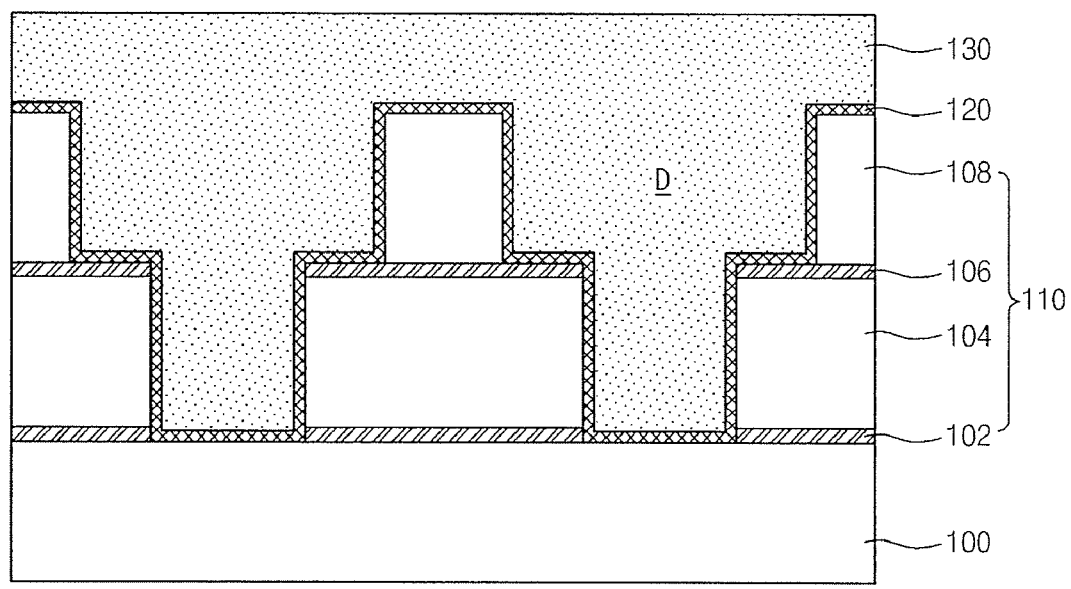

Referring to FIG. 1B, a barrier layer 120 is formed on the surface of the interlayer dielectric 110 and including the surface of the wiring forming area D. The barrier layer 120 comprises any one of the materials selected from Ti, TiN, Ta, TaN and Ru layers or a stacked structured thereof. The barrier layer 120 may also comprise a stack of an Ru layer and an RuOx layer. The barrier layer 120 is formed to have an overall thickness less than 500 Å, and preferably, between 100~500 Å.

A copper layer 130 is then formed on the barrier layer 120 to completely fill the wiring forming area D. The copper layer 130 can be formed using a CVD (chemical vapor deposition) process, a PVD (physical vapor deposition) process, an ALD (atomic layer deposition) process, or an electroplating process. Preferably, the copper layer 130 is formed using an electroplating process. The copper layer 130 is formed to have a thickness corresponding to 2 to 5 times the depth of the trench T in the wiring forming area D, and preferably, 1.5 to 3 times the depth when considering overburden.

Figure 1C:
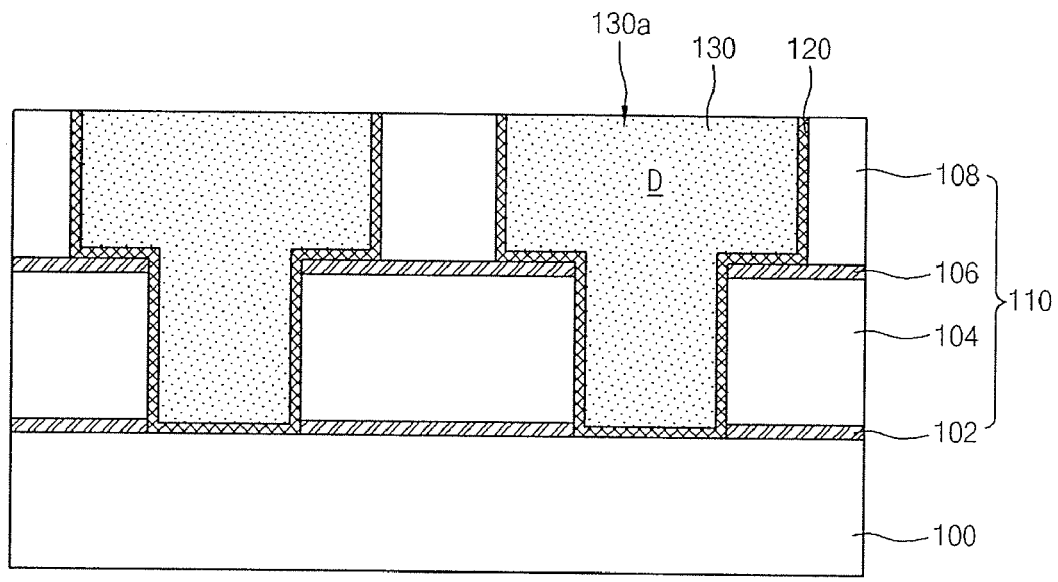

Referring to FIG. 1C, the copper layer 130 and the barrier layer 120 formed on the upper surface of the interlayer dielectric 110 are partially removed through a CMP process such that the interlayer dielectric 110 is exposed. Through this process, a copper wiring 130a is formed in the wiring forming area D. A CMP process is conducted in three steps. In a first step, the copper layer 130 is polished such that the copper layer 130 remains on the barrier layer 120 located on the upper surface of the interlayer dielectric 110 by a predetermined thickness, e.g., less than 3,000 Å, and preferably, between 500~1,000 Å. In a second step, the copper layer 130 is polished such that the copper layer 130 remaining on the barrier layer 120 on the upper surface of the interlayer dielectric 110 is completely removed. And in a third step, the entire portion of the barrier layer 120 existing on the upper surface of the interlayer dielectric 110 and a partial thickness of the interlayer dielectric 110 are polished. Alternatively, the CMP process may be conducted using two steps rather than three steps by simultaneously conducting the first and second steps described above.

The first step is conducted by setting a polishing pressure between 0.5~4 psi for example, and preferably, between 0.5~2 psi, and setting the rotational speeds of a polishing head and a platen between 20~150 rpm, and preferably, between 70~120 rpm. Further, the first step is conducted by setting the amount of a slurry to 100~500 ml/min for example, and preferably, between 250~350 ml/min so that the first step can be conducted in a condition where passivation to some extent is assured. In addition, in order to prevent a polishing speed from decreasing due to the degradation of a polishing pad, the first step is conducted by adopting both in-situ conditioning and ex-situ conditioning. The in-situ conditioning is performed by setting a pressure to 5 lbf or greater, and preferably, between 5~7 lbf, and setting the rotational speed of a conditioner to 50 rpm or greater, and preferably, between 70~120 rpm.

The second step is conducted according to the same process conditions as those listed for the first step.

The third step is conducted by selecting a slurry that does not have a great etching selectivity among the copper layer 130, the barrier layer 120, and the oxide layer as the material of the interlayer dielectric 110. For example, the third step is conducted using a slurry that has an etching selectivity ratio of 1:0.3~1.2:0.3~1.5 among the copper layer 130, the barrier layer 120, and the oxide layer. Moreover, the third step is conducted by setting a polishing pressure to, for example, 0.5~4 psi, and preferably, between 0.5~2 psi. Furthermore, the third step is conducted using a polytex-based cotton pad in order to keep the final surface morphology of the polishing pad good. In addition, the third step is conducted by adopting only ex-situ conditioning to prevent the occurrence of defects by debris of the polishing pad. The ex-situ conditioning is performed by applying a low pressure of 1~5 lbf, and preferably, between 1~3 lbf, and setting the rotational speed of a conditioner to 20~200 rpm, and preferably, between 50~120 rpm.

Figure 1D:
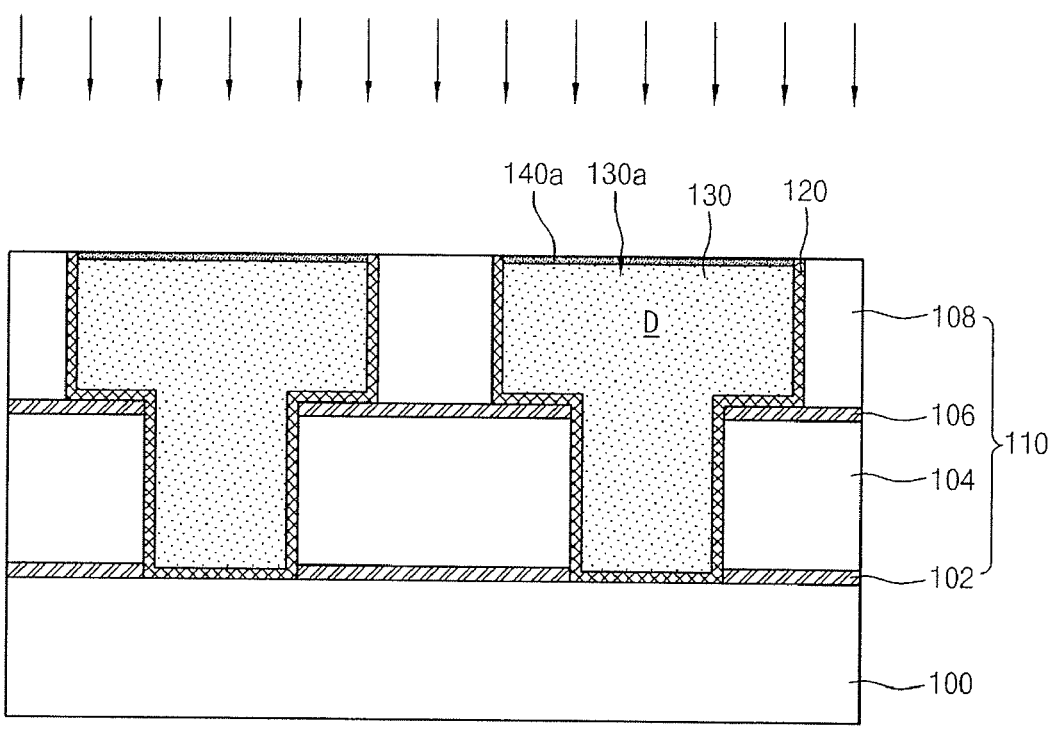

Referring to FIG. 1D, a post-cleaning process is conducted in-situ for the resultant semiconductor substrate 100 having undergone the CMP process, more precisely, the copper layer 130 having undergone the CMP process, in a state where a drying process is not conducted.

The post-cleaning process is conducted according to a sequence of megasonic cleaning, chemical cleaning, and IPA (isopropyl alcohol) drying. The megasonic cleaning is conducted by using deionized water (DIW) and setting megasonic power to 5~1,000 W, and preferably, between 10~100 W. The chemical cleaning is conducted such that a primary chemical cleaning using a citric acid-based chemical and a secondary chemical cleaning using an ascorbic acid-based chemical are sequentially conducted.

In the primary chemical cleaning, the citric acid-based chemical is adjusted to have a pH value of 6.7~12.7 and an electrochemical potential of −0.4~0.4V. The secondary chemical cleaning is conducted by adding deionized water, ethanolamine, and TMAH (tetra methyl ammonium hydroxide) to the ascorbic acid-based chemical. The TMAH is added to prevent corrosion and the ethanolamine is added to remove residue such as polymer. The ascorbic acid-based chemical is mixed in the amount of 1~10 wt % of the entire chemical solution, the deionized water is mixed in the amount of 70~90 wt % of the entire chemical solution, the ethanolamine is mixed in the amount of 1~10 wt % of the entire chemical solution, and the TMAH is mixed in the amount of 1~15 wt % of the entire chemical solution.

Thus, according to an embodiment of the present invention, it is possible to prevent the migration of copper ions over time and the resulting defects caused when forming a copper wiring according to the conventional art by conducting the post-cleaning process including the primary and secondary chemical cleaning.

More specifically, after a CMP process is conducted for a copper layer, conventionally, a $Cu_2O$ layer formed on the surface of the copper layer is oxidated to CuO over time through reaction with $H_2$ or $O_2$ present in a process line. In this situation, copper ions are produced and accumulate on an oxide layer constituting the interlayer dielectric and causes failure in terms of BV (breakdown voltage) and TDDB.

Figure 2:
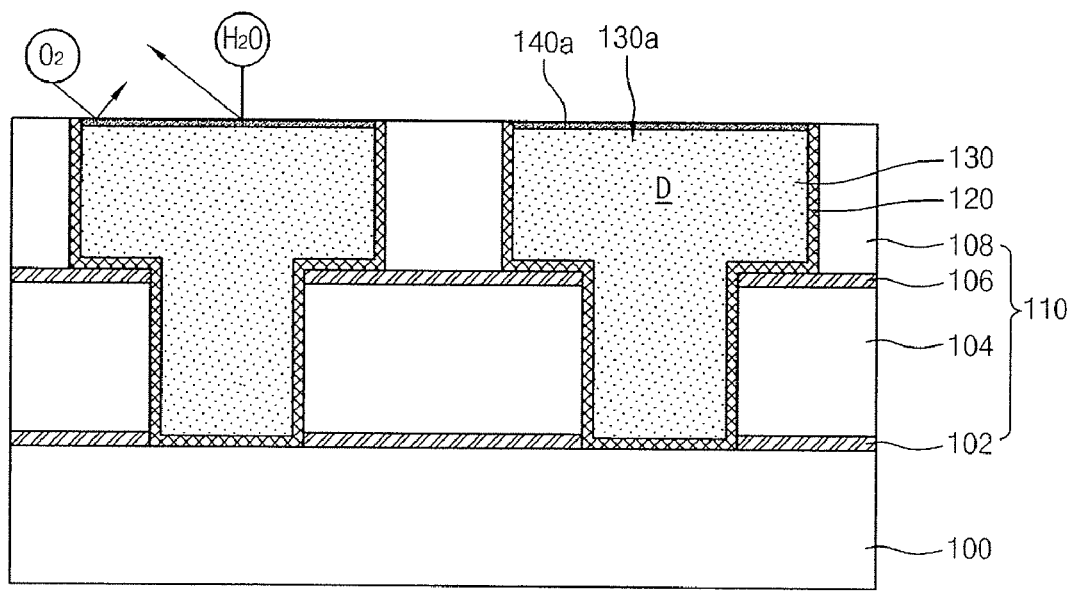
FIG. 2 is a sectional view showing a state of the semiconductor device after conducting a chemical cleaning process using a citric acid-based chemical and an ascorbic acid-based chemical in accordance with one embodiment of the present invention.

However, according to the present invention as described above, after the CMP process is conducted for the copper layer, an insoluble $Cu_2O$ layer 140a is formed on the surface of the CMPed (chemically and mechanically polished) copper layer 130, i.e., the copper wiring 130a as shown in FIG. 2, by continuously conducting the primary chemical cleaning using the citric acid-based chemical adjusted in a pH value and an electrochemical potential and the secondary chemical cleaning using the ascorbic acid-based chemical, as the post-cleaning process for the copper layer having undergone the CMP process and being in a wetted state. As a result, the corrosion of the copper wiring 130a is prevented due to the presence of the $Cu_2O$ layer 140a.

Accordingly, according to an embodiment of the present invention, the migration of copper ions over time can be effectively prevented since the insoluble $Cu_2O$ layer 140a is formed on the surface of the copper wiring 130a through the post-cleaning process that includes the primary chemical cleaning using the citric acid-based chemical and the secondary chemical cleaning using the ascorbic acid-based chemical. As a result, it is possible to prevent a bridge phenomenon from occurring between adjoining copper is wirings 130a, deterioration of leakage current characteristics, and a TDDB failure from resulting, whereby the reliability of a semiconductor device can be vastly improved.

Figure 1E:
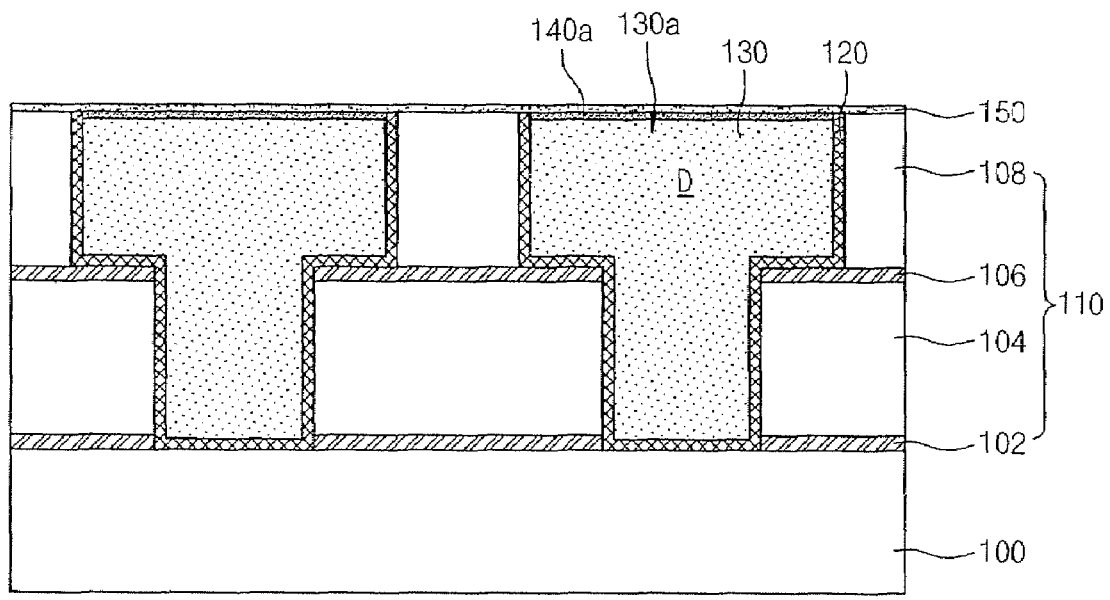

Referring to FIG. 1E, the IPA (isopropyl alcohol) drying is conducted as the final step of the post-cleaning process for the resulting semiconductor substrate 100 having undergone the megasonic cleaning and the two stages of chemical cleaning. The surface of the dried copper wiring 130a is then plasma-processed using any one of $H_2$, $N_2$, and $NH_3$. A diffusion barrier 150 is subsequently formed on the interlayer dielectric 110 including the plasma-processed copper wirings 130a. The diffusion barrier 150 is formed as any one of an $Si_3N_4$ layer, an SiOC layer, an SiC layer, and an SiCN layer.

Thereafter, the formation of a copper wiring according to an embodiment of the present invention is completed by sequentially conducting a series of well-known subsequent processes.

Figure 3:
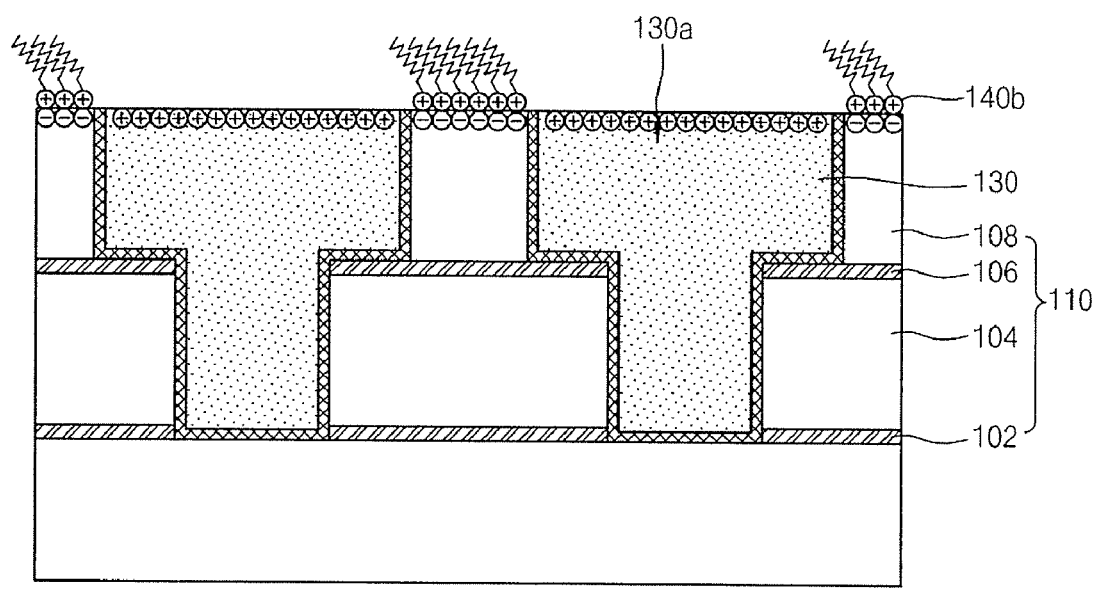
FIG. 3 is a sectional view showing a state of the semiconductor device after conducting a chemical cleaning process using quaternary alkyl ammonium salt in accordance with another embodiment of the present invention.

FIG. 3 is a sectional view explaining a method of forming a copper wiring in a semiconductor device in accordance with another embodiment of the present invention. In the present embodiment of the invention, all the process steps for the post-cleaning process, excluding the chemical cleaning, are the same as those of the aforementioned embodiment. Therefore, only the differences between the present embodiment and the aforementioned embodiment will be described herein in detail.

According to the present embodiment of the invention, a post-cleaning process for the copper layer 130 and the interlayer dielectric 110 is performed after the CMP process is completed for the copper layer 130 that is formed to fill the wiring forming area D. The post-cleaning process for the copper layer 130 and the interlayer dielectric 110 is conducted by using quaternary alkyl ammonium salt instead of the cleaning using the citric acid-based chemical and the ascorbic acid-based chemical as in the aforementioned embodiment.

More specifically, in the present embodiment of the invention, the post-cleaning process is implemented for the copper layer 130 having undergone the CMP process and the interlayer dielectric and being in a wetted state in such a way so as to sequentially conduct megasonic cleaning, chemical cleaning by using quaternary alkyl ammonium salt, and IPA drying. Here, the megasonic cleaning is conducted by using deionized water and setting megasonic power to 5~1,000 W, and preferably, between 10~100 W as in the aforementioned embodiment.

The chemical cleaning using quaternary alkyl ammonium salt is conducted to prevent the oxide layer and copper ions from reacting with each other. The quaternary alkyl ammonium salt includes a polyquaternium-based chemical. Typical examples of the polyquaternium-based chemical include a dodecylethyldimethylammonium bromide, an oleyltriethylammonium bromide, a didecyldimethylammonium phosphate, and a cetyltrimethylammonium chloride.

According to the present embodiment of the invention, the migration of copper ions can be prevented due to the fact that the chemical cleaning of the post-cleaning process is conducted by using the quaternary alkyl ammonium salt. As a result, it is possible to prevent a bridge phenomenon from occurring between adjoining copper wirings, deterioration of leakage current characteristics, and a TDDB failure from occurring.

More specifically, the quaternary alkyl ammonium salt such as polyquaternium is a surfactant compound that reacts with the oxide layer. If the chemical cleaning is conducted using the quaternary alkyl ammonium salt as shown in FIG. 3, the radicals of the quaternary alkyl ammonium salt react with the oxide layer that forms the second insulation layer 108 and are adsorbed into the surface of the oxide layer. Accordingly, the surface of the oxide layer is passivated.

Thus, after the copper layer is CMPed, even though over time copper ions are produced, the produced copper ions cannot migrate to the surface of the second insulation layer 108 due to the presence of the radicals of the quaternary alkyl ammonium salt. Therefore, the migration of copper ions and the resulting defects can be prevented.

According to the current embodiment of the present invention, the migration of copper ions can be effectively prevented since the surface of the insulation layer formed of the oxide layer is passivated rather than the surface of the copper layer having undergone the CMP process. As a result, it is possible to prevent a bridge phenomenon from occurring between adjoining copper wirings, the deterioration of leakage current characteristics, and a TDDB failure from occurring, due to the migration of the copper ions, whereby the reliability of a semiconductor device can be vastly improved.

Thereafter, the formation of a copper wiring in a semiconductor device in accordance with the current embodiment of the present invention is completed by sequentially conducting a series of subsequent processes including the plasma-processing of the surfaces of the copper wirings 130a and the deposition of a diffusion barrier 150.

In still another embodiment of the present invention, a post-cleaning process for a copper layer having undergone a CMP process is implemented by sequentially conducting megasonic cleaning, chemical cleaning by using a citric acid-based chemical, cleaning by using quaternary alkyl ammonium salt, and IPA drying.

According to the current embodiment of the present invention, the megasonic cleaning is conducted using deionized water and setting megasonic power to 5~1,000 W, and preferably, between 10~100 W. The chemical cleaning using the citric acid-based chemical is conducted in the same manner as described above by adjusting the pH value of the citric acid-based chemical to 6.7~12.7 and the electrochemical potential to −0.4~0.4V.

Figure 4:
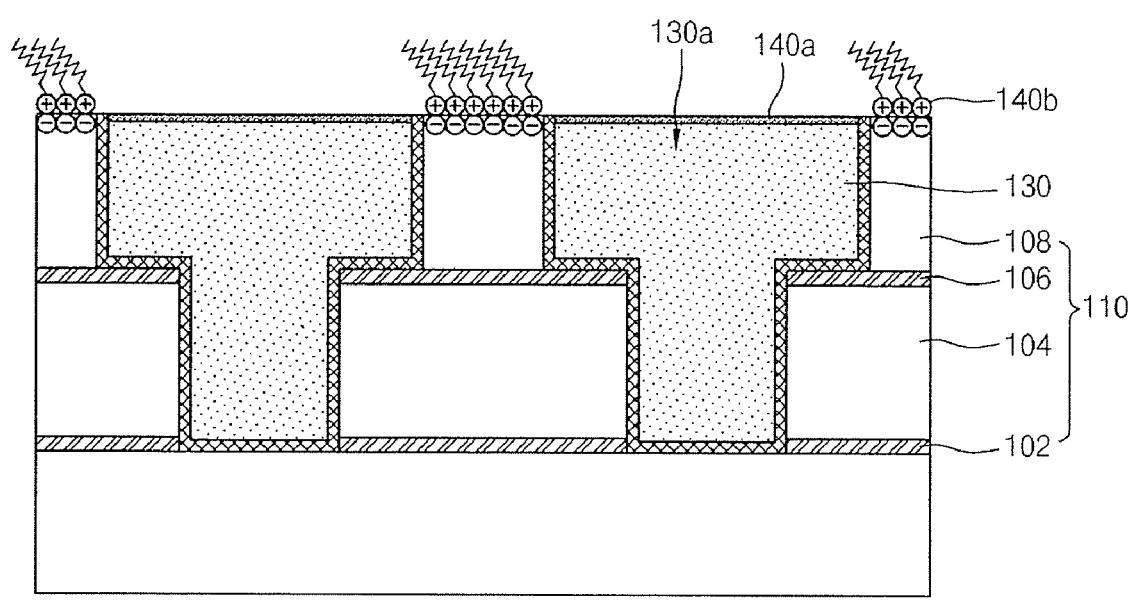
FIG. 4 is a sectional view showing a state of the semiconductor device after conducting a chemical cleaning process using a citric acid-based chemical and quaternary alkyl ammonium salt in accordance with still another embodiment of the present invention.

As shown in FIG. 4, in still another embodiment of the present invention, as the chemical cleaning using the citric acid-based chemical is conducted, an insoluble $Cu_2O$ layer 140a is formed on the surface of the CMPed copper layer 130, i.e., the copper wiring 130a. As a result, the migration of copper ions can be prevented. Further, as cleaning using the quaternary alkyl ammonium salt is conducted, a passivation layer 140b is formed on the surface of the interlayer dielectric 110 formed of the oxide layer. As a result, the migration of copper ions can be prevented by the passivation layer 140b.

Again, in the current embodiment of the present invention, it is possible to prevent a bridge phenomenon from occurring between adjoining copper wirings, the deterioration of leakage current characteristics, and a TDDB failure from occurring because the migration of copper ions over time after the copper layer is CMPed can be effectively prevented, whereby the reliability of a semiconductor device can be vastly improved.

Thereafter, the formation of a copper wiring in a semiconductor device according to the current embodiment of the present embodiment is completed by sequentially conducting a series of subsequent processes including the plasma-processing of the surfaces of the copper wirings 130a and the deposition of a diffusion barrier 150.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A method for forming a copper wiring in a semiconductor device including a step of conducting a post-cleaning process for a copper layer having previously undergone a CMP (chemical mechanical polish) process, the post-cleaning process comprising the steps of:
   conducting a primary chemical cleaning to the copper layer using a citric acid-based chemical; and
   conducting a secondary chemical cleaning of the copper layer having undergone the primary chemical cleaning using an ascorbic acid-based chemical, wherein the secondary chemical cleaning is conducted by adding deionized water, ethanolamine, and TMAH (tetra methyl ammonium hydroxide) to the ascorbic acid-based chemical, and wherein the primary chemical cleaning process and the secondary chemical cleaning process are performed in sequence such that an insoluble $CU_2O$ layer is formed in the surface of the CMPed copper layer.

2. The method according to claim 1, wherein, before the step of conducting the primary chemical cleaning, the post-cleaning process further comprises the step of:
   conducting a megasonic cleaning.

3. The method according to claim 2, wherein the megasonic cleaning is conducted using deionized water and setting megasonic power in a range of 5~1,000 W.

4. The method according to claim 1, wherein the citric acid-based chemical has a pH value in a range of 6.7~12.7.

5. The method according to claim 1, wherein the citric acid-based chemical has an electrochemical potential in a range of −0.4~0.4V.

6. The method according to claim 1, wherein the ascorbic acid-based chemical is mixed in an amount of 1~10 wt % of an entire chemical solution.

7. The method according to claim 1, wherein the deionized water is mixed in an amount of 70~90 wt % of an entire chemical solution.

8. The method according to claim 1, wherein the ethanolamine is mixed in an amount of 1~10 wt % of an entire chemical solution.

9. The method according to claim 1, wherein the TMAH is mixed in an amount of 1~15 wt % of an entire chemical solution.

10. The method according to claim 1, wherein, after the step of conducting the secondary chemical cleaning, the post-cleaning process further comprises the step of:
    conducting IPA (isopropyl alcohol) drying.

11. A method for forming a copper wiring in a semiconductor device, comprising the steps of:
    forming an interlayer dielectric on a semiconductor substrate, the interlayer dielectric having a wiring forming area defined therein;
    depositing a copper layer to fill the wiring forming area;
    removing a portion of the copper layer through a CMP (chemical mechanical polish) process until the interlayer dielectric is exposed; and
    conducting a post-cleaning process to the copper layer having undergone the CMP process, the post-cleaning process including a primary chemical cleaning using a citric acid-based chemical and a secondary chemical cleaning using an ascorbic acid-based chemical,
    wherein the secondary chemical cleaning is conducted by adding deionized water, ethanolamine, and TMAH (tetra methyl ammonium hydroxide) to the ascorbic acid-based chemical, and wherein the primary chemical cleaning process and the secondary chemical cleaning process are performed in sequence such that an insoluble $CU_2O$ layer is formed in the surface of the CMPed copper layer.

12. The method according to claim 11, wherein, after the step of forming the interlayer dielectric and before the step of depositing the copper layer, the method further comprises the step of:
    forming a barrier layer on the interlayer dielectric including a surface of the wiring forming area.

13. The method according to claim 12, wherein the barrier layer comprises at least one layer selected from Ti, TiN, Ta, TaN and Ru layers.

14. The method according to claim 12, wherein the barrier layer has a thickness in a range of 100~500 Å.

15. The method according to claim 11, wherein the post-cleaning process further comprises:
    megasonic cleaning before the primary chemical cleaning.

16. The method according to claim 15, wherein the megasonic cleaning is conducted using deionized water and setting megasonic power in a range of 5~1,000 W.

17. The method according to claim 11, wherein the citric acid-based chemical has a pH value in a range of 6.7~12.7.

18. The method according to claim 11, wherein the citric acid-based chemical has an electrochemical potential in a range of −0.4~0.4V.

19. The method according to claim 11, wherein the ascorbic acid-based chemical is mixed in an amount of 1~10 wt % of an entire chemical solution.

20. The method according to claim 11, wherein the deionized water is mixed in an amount of 70~90 wt % of an entire chemical solution.

21. The method according to claim 11, wherein the ethanolamine is mixed in an amount of 1~10 wt % of an entire chemical solution.

22. The method according to claim 11, wherein the TMAH is mixed in an amount of 1~15 wt % of an entire chemical solution.

23. The method according to claim 11, wherein the post-cleaning process further comprises:
IPA (isopropyl alcohol) drying after the second chemical cleaning.

24. The method according to claim 11, wherein, after the step of conducting the post-cleaning process, the method further comprises the step of:
plasma-processing a surface of the copper layer.

25. The method according to claim 24, wherein the plasma-processing is conducted using any one of $H_2$, $N_2$ and $NH_3$.

26. The method according to claim 24, wherein, after the plasma-processing step, the method further comprises the step of:
forming a diffusion barrier on the copper layer.

27. The method according to claim 26, wherein the diffusion barrier comprises any one of an $Si_3N_4$ layer, an SiOC layer, an SiC layer, and an SiCN layer.

28. A method for forming a copper wiring in a semiconductor device, comprising the steps of:
conducting a CMP (chemical mechanical polish) process of a copper layer deposited in a wiring forming area defined in an interlayer dielectric, to expose the interlayer dielectric, and
conducting a post-cleaning process on the copper layer having undergone the CMP process and the interlayer dielectric, wherein the post-cleaning process includes chemical cleaning using quaternary alkyl ammonium salt which comprises a polyquaternium-based chemical,
wherein the polyquaternium-based chemical comprises any one of a dodecylethyldimethylammonium bromide, an oleyltriethylammonium bromide, and a didecyldimethylammonium phosphate.

29. The method according to claim 28, wherein the post-cleaning process further comprises:
megasonic cleaning before the chemical cleaning using the quaternary alkyl ammonium salt.

30. The method according to claim 29, wherein the megasonic cleaning is conducted using deionized water and setting megasonic power in a range of 5~1,000 W.

31. The method according to claim 28, wherein, before the chemical cleaning using the quaternary alkyl ammonium salt, the post-cleaning process further comprises:
chemical cleaning using a citric acid-based chemical.

32. The method according to claim 31, wherein the citric acid-based chemical has a pH value in a range of 6.7~12.7.

33. The method according to claim 31, wherein the citric acid-based chemical has an electrochemical potential in a range of −0.4~0.4V.

34. A method for forming a copper wiring in a semiconductor device, comprising the steps of:
forming an interlayer dielectric on a semiconductor substrate, the interlayer dielectric having a wiring forming area defined therein;
depositing a copper layer to fill the wiring forming area;
removing a portion of the copper layer through a (chemical mechanical polish) CMP process until the interlayer dielectric is exposed; and
conducting a post-cleaning process to the copper layer having undergone the CMP process and the interlayer dielectric, the post-cleaning process including a chemical cleaning using quaternary alkyl ammonium salt which comprises a polyquaternium-based chemical,
wherein the polyquaternium-based chemical comprises any one of a dodecylethyldimethylammonium bromide, an oleyltriethylammonium bromide, a didecyldimethylammonium phosphate.

35. The method according to claim 34, wherein, after the step of forming the interlayer dielectric and before the step of depositing the copper layer, the method further comprises the step of:
forming a barrier layer on the interlayer dielectric including a surface of the wiring forming area.

36. The method according to claim 35, wherein the barrier layer comprises at least one layer selected from Ti, TiN, Ta, TaN and Ru layers.

37. The method according to claim 35, wherein the barrier layer has a thickness in a range of 100~500 Å.

38. The method according to claim 34, wherein the post-cleaning process further comprises:
megasonic cleaning before the chemical cleaning using the quaternary alkyl ammonium salt.

39. The method according to claim 38, wherein the megasonic cleaning is conducted using deionized water and setting megasonic power in a range of 5~1,000 W.

40. The method according to claim 34, wherein, before the chemical cleaning using the quaternary alkyl ammonium salt, the post-cleaning process further comprises:
megasonic cleaning, and
chemical cleaning using a citric acid-based chemical.

41. The method according to claim 40, wherein the megasonic cleaning is conducted using deionized water and setting megasonic power in a range of 5~1,000 W.

42. The method according to claim 40, wherein the citric acid-based chemical has a pH value in a range of 6.7~12.7.

43. The method according to claim 40, wherein the citric acid-based chemical has an electrochemical potential in a range of −0.4~0.4V.

44. The method according to claim 34, wherein the post-cleaning process further comprises:
IPA (isopropyl alcohol) drying after the chemical cleaning using the quaternary alkyl ammonium salt.

45. The method according to claim 44, wherein, after the step of conducting the post-cleaning process, the method further comprises the step of:
plasma-processing a surface of the copper layer.

46. The method according to claim 45, wherein the plasma-processing is conducted using any one of $H_2$, $N_2$ and $NH_3$.

47. The method according to claim 45, wherein, after the plasma-processing step, the method further comprises the step of:
forming a diffusion barrier on the copper layer.

48. The method according to claim 47, wherein the diffusion barrier comprises any one of an $Si_3N_4$ layer, an SiOC layer, an SiC layer, and an SiCN layer.

* * * * *